United States Patent
Emoto et al.

(10) Patent No.: US 9,676,999 B2
(45) Date of Patent: Jun. 13, 2017

(54) PHOSPHOR, LIGHT EMITTING ELEMENT, AND LIGHT EMITTING DEVICE

(71) Applicant: DENKA COMPANY LIMITED, Tokyo (JP)

(72) Inventors: Hideyuki Emoto, Tokyo (JP); Shinichi Yanagi, Tokyo (JP); Masayoshi Ichikawa, Fukuoka (JP); Kazuhiro Ito, Tokyo (JP)

(73) Assignee: DENKA COMPANY LIMITED, Tokyo, OT (JP)

( * ) Notice: Subject to any disclaimer, the term of this patent is extended or adjusted under 35 U.S.C. 154(b) by 0 days.

(21) Appl. No.: 15/121,318

(22) PCT Filed: Feb. 25, 2015

(86) PCT No.: PCT/JP2015/055384
§ 371 (c)(1),
(2) Date: Aug. 24, 2016

(87) PCT Pub. No.: WO2015/129743
PCT Pub. Date: Sep. 3, 2015

(65) Prior Publication Data
US 2017/0009133 A1    Jan. 12, 2017

(30) Foreign Application Priority Data

Feb. 26, 2014 (JP) ................................ 2014-036008
Feb. 26, 2014 (JP) ................................ 2014-036010

(51) Int. Cl.
H01L 33/50    (2010.01)
C09K 11/61    (2006.01)

(52) U.S. Cl.
CPC ............ *C09K 11/617* (2013.01); *H01L 33/50* (2013.01); *H01L 33/501* (2013.01); *H01L 33/502* (2013.01)

(58) Field of Classification Search
None
See application file for complete search history.

(56) References Cited

U.S. PATENT DOCUMENTS

| 3,576,756 A | 4/1971 | Russo |
| 6,020,067 A | 2/2000 | Iwama et al. |

(Continued)

FOREIGN PATENT DOCUMENTS

| JP | 58089680 | 5/1983 |
| JP | 04118486 | 6/1992 |

(Continued)

*Primary Examiner* — Minh-Loan Tran
(74) *Attorney, Agent, or Firm* — Rudy J. Ng; Carol L. Francis; Bozicevic, Field & Francis LLP

(57) ABSTRACT

The present invention relates to an $Mn^{4+}$-activated complex fluoride phosphor with improved moisture resistance due to modification of the particle surface, and a light emitting element and light emitting device having excellent color rendering properties and stability due to the use of this phosphor.

The phosphor of the present invention is characterized in that it is represented by the general formula: $A_2MF_6:Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises Ca in a concentration range of at least 20 ppm and at most 10,000 ppm or Cl in a concentration range of at least 20 ppm and at most 300 ppm.

4 Claims, 2 Drawing Sheets

(56) References Cited

U.S. PATENT DOCUMENTS

| | | | | |
|---|---|---|---|---|
| 7,497,973 B2 * | 3/2009 | Radkov | ............... | C09K 11/617 |
| | | | | 252/301.4 F |
| 8,057,706 B1 | 11/2011 | Setlur et al. | | |
| 8,491,816 B2 * | 7/2013 | Hong | ................... | C09K 11/616 |
| | | | | 252/301.4 H |
| 2006/0169998 A1 | 8/2006 | Radkov et al. | | |
| 2009/0110285 A1 | 4/2009 | Elad et al. | | |
| 2010/0142189 A1 | 6/2010 | Hong et al. | | |
| 2011/0043101 A1 | 2/2011 | Masuda et al. | | |
| 2011/0058583 A1 | 3/2011 | Fukuda et al. | | |
| 2012/0104317 A1 | 5/2012 | Nagatomi et al. | | |
| 2012/0256125 A1 | 10/2012 | Kaneyoshi et al. | | |
| 2013/0026908 A1 | 1/2013 | Nagatomi et al. | | |
| 2013/0181164 A1 | 7/2013 | Sohn et al. | | |
| 2014/0320788 A1 * | 10/2014 | Weiler | .................. | H01L 33/502 |
| | | | | 349/71 |
| 2015/0061488 A1 | 3/2015 | Yoshida | | |

FOREIGN PATENT DOCUMENTS

| | | |
|---|---|---|
| JP | 2009096823 | 5/2009 |
| JP | 2013014715 | 1/2013 |
| JP | 2013177511 | 9/2013 |
| JP | 2013249375 | 12/2013 |
| WO | 2013105345 | 7/2013 |
| WO | 2013105346 | 7/2013 |

* cited by examiner

PHOSPHOR, LIGHT EMITTING ELEMENT, AND LIGHT EMITTING DEVICE

TECHNICAL FIELD

The present invention relates to a phosphor that is excited by UV rays or blue light and emits red light, a light emitting element using this phosphor, and a light emitting device using this light emitting element. More specifically, the present invention relates to an $Mn^{4+}$-activated complex fluoride phosphor with improved moisture resistance due to modification of the particle surface, and a light emitting element and light emitting device having excellent color rendering properties and stability due to the use of this phosphor.

BACKGROUND ART

As white LEDs, those of the type in which pseudo-white light is obtained by combining a blue LED chip with a yellow phosphor are widely used. However, while white LEDs of this type fall within the white color range in terms of their chromaticity coordinate values, they have few emitted light components in the red color range and the like, so the appearance of an object illuminated by such a white LED differs considerably from the appearance of an object illuminated with natural light. In other words, such white LEDs have poor color rendering properties which are an indicator of the naturalness of appearance of objects.

Therefore, white LEDs with improved color rendering properties have been developed for practical use by combining red phosphors, orange phosphors or the like in addition to yellow phosphors, so as to compensate for the insufficient red components.

As such red phosphors, nitride phosphors and oxynitride phosphors activated with $Eu^{2+}$ are known. Representative of these phosphors are $Sr_2Si_5N_8:Eu^{2+}$, $CaAlSiN_3:Eu^{2+}$, $(Ca,Sr)AlSiN_3:Eu^{2+}$ and the like.

However, phosphors in which $Eu^{2+}$ is activated as the light emission central ion have a light emission spectrum with a broad half value width, so they have a tendency to include relatively many spectral components in wavelength regions outside the range visible to humans, and they have difficulty in achieving high luminance.

In recent years, phosphors using $Eu^{3+}$ and $Mn^{4+}$ as the light emission central ions have been developed as red phosphors having light emission spectra with narrow half value width and including many spectral components in regions of high visual sensitivity. Patent Documents 1 to 4 disclose phosphors in which $Mn^{4+}$ is activated in complex fluoride crystal $K_2SiF_6$, and light emitting devices using these phosphors. These phosphors are capable of achieving red light emissions with a narrow half value width, and the light emitting devices using these phosphors are held to achieve excellent color rendering properties and color reproducibility.

RELATED ART DOCUMENTS

Patent Documents

Patent Document 1: JP 2009-528429 A
Patent Document 2: WO 2009/110285
Patent Document 3: U.S. Pat. No. 3,576,756 A
Patent Document 4: JP 2012-224536 A

SUMMARY OF THE INVENTION

Problems to be Solved by the Invention

However, $Mn^{4+}$-activated phosphors that have complex fluoride crystals as their matrix have low stability, and in particular, hydrolysis of the phosphor tends to progress upon contact with water or water vapor. When hydrolysis occurs, not only are the fluorescence properties reduced, but also, the peripheral materials may be corroded by fluorine ions or hydrogen fluoride generated by the hydrolysis. For this reason, there were problems in development for practical use in terms of durability and reliability in LED light emitting devices comprising phosphors dispersed in sealing resins not capable of completely shutting out water vapor.

Means for Solving the Problems

As a result of performing diligent study in view of the above-described problems, the present inventors discovered that the moisture resistance can be significantly improved without reducing the fluorescence properties, by treating $Mn^{4+}$-activated complex fluoride phosphors, which have excellent luminance, with a compound to serve as a Ca or Cl source and modifying the particle surfaces, thereby arriving at the present invention.

In other words, the phosphor of the present invention is basically a phosphor represented by the general formula: $A_2MF_6:Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises Ca in a concentration range of at least 20 ppm and at most 10,000 ppm or Cl in a concentration range of at least 20 ppm and at most 300 ppm.

In this phosphor, element A is preferably K and element M is preferably Si and/or Ge.

Additionally, the light emitting element of the present invention basically comprises the aforementioned phosphor and an emission light source. Furthermore, the light emitting device of the present invention basically comprises the aforementioned light emitting element.

Effects of the Invention

The phosphor according to the present invention is a phosphor that has significantly superior moisture resistance, comprising Ca or Cl in a predetermined concentration range in an $Mn^{4+}$-activated complex fluoride phosphor, which is known as a high-luminance red-emitting phosphor.

For this reason, the light emitting element and light emitting device according to the present invention which use this phosphor have high color rendering properties and color reproducibility, and also have a long life span with little change over time.

MODES FOR CARRYING OUT THE INVENTION

Figure 1:
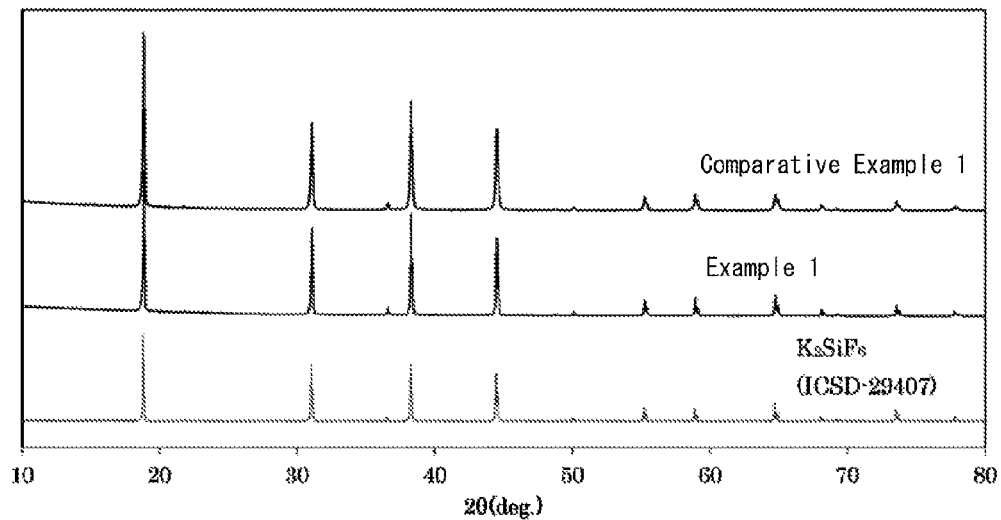
FIG. 1 A diagram showing the X-ray diffraction patterns of $K_2SiF_6$, Example 1 and Comparative Example 1.

The present invention is a phosphor represented by the general formula: $A_2MF_6:Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises Ca in a concentration range of at least 20 ppm and at most 10,000 ppm or Cl in a concentration range of at least 20 ppm and at most 300 ppm, on the particle surface.

Here, "particle surface" refers to the range over which the surface modification by the compound to serve as the Ca or Cl source reaches, and is preferably in a range from the surface (depth 0 μm) of the phosphor to a depth of 1.5 μm. If the range of modification is too deep, then the excitation light absorption efficiency of the phosphor and the fluorescent light extraction efficiency from the phosphor may be reduced.

Additionally, "comprising" Ca or Cl on the particle surface typically includes states wherein compounds containing Ca are deposited on the phosphor particle surface, or states wherein a portion of the F constituting the matrix crystal of the phosphor is substituted by Cl on the phosphor particle surface.

In the above-given general formula: $A_2MF_6:Mn^{4+}$, $Mn^{4+}$ is the ion that is activated as the light emission center, and is in the form of a solid solution substituting a portion of the element M.

The element A is an alkali metal element comprising at least K, and preferably has a high K content. Specific examples of the element A include K alone, a combination of K and Na, a combination of K and Li, and a combination of K, Na and Li. In order to obtain a stronger light emission intensity, K alone is preferred.

The element M is a metal element of at least one type chosen from among Si, Ge, Sn, Ti, Zr and Hf. The element M preferably comprises at least Si and/or Ge, and specific examples include Si alone, Ge alone, a combination of Si and Ge, a combination of Si and Sn, a combination of Si and Ti, a combination of Si, Ge and Sn, a combination of Si, Ge and Ti, a combination of Si, Sn and Ti, and a combination of Si, Ge, Sn and Ti. The element M affects the excitation band of the phosphor. Si and/or Ge are preferred for achieving efficient light emissions with blue light.

The method for producing the phosphor before modifying the particle surface is not particularly limited, and a well-known production method such as those described in Patent Documents 1 to 4 may be used. Specifically, it is possible to use:

a method of dissolving the compound to serve as the matrix crystal of the phosphor and a compound comprising $Mn^{4+}$ which is the light emission center in hydrofluoric acid, and evaporating the solvent to solidify and cause reprecipitation (Patent Document 1);

a method of immersing a single metal such as silicon in a mixed solution of hydrofluoric acid and potassium permanganate (Patent Document 2);

a method of adding a poor solvent such as acetone or methanol to an aqueous hydrofluoric acid solution in which the component elements of the complex fluoride phosphor are dissolved, so as to cause precipitation of the phosphor (Patent Document 3); and a method of dissolving the component elements of the complex fluoride phosphor in two or more types of hydrofluoric acid from which the solid does not precipitate, mixing the two and causing a reaction and crystallization (Patent Document 4).

The $Mn^{4+}$-activated complex fluoride phosphors before surface modification produced by these methods are soluble in water, react with water and undergo hydrolysis, and generate hydrogen fluoride, which is highly corrosive, and colored compounds that absorb visible light, such as manganese dioxide. Hydrogen fluoride accelerates the deterioration of constituent members constituting light emitting elements.

By treating these phosphors with compounds that serve as a Ca or Cl source and including Ca or Cl in a predetermined concentration range on the particle surface, the moisture resistance can be significantly improved.

The means for making the particle surface of the phosphor comprise Ca is not particularly limited as long as Ca alone or a Ca-containing compound generated from the Ca source is able to be physically or chemically deposited on the phosphor particle surface, and it may be wet or dry. As long as the Ca-containing compound has low water solubility, it may be either crystalline or amorphous, and a preferable example is calcium fluoride ($CaF_2$). Calcium fluoride not only has extremely low solubility with respect to water, but it also does not easily dissolve in hydrofluoric acid which is used during production of phosphors nor in organic solvents such as acetone, methanol and ethanol, and is therefore suitable for use as a Ca-containing compound.

Preferable examples for depositing the Ca-containing compound on the particle surface of the phosphor will be indicated below.

First, the phosphor particles are dispersed in an organic solvent alone or in a mixed solution with hydrofluoric acid, to prepare a suspension. The organic solvent is preferably acetone, methanol or ethanol. Next, to this suspension is added a solution in which is dissolved a compound to serve as a Ca source such as calcium nitrate. The solvent may be water or an organic solvent. The Ca ions in the solution react with hydrogen fluoride present in the suspension and are precipitated onto the phosphor particle surfaces as $CaF_2$.

The hydrogen fluoride which is the reaction source of this reaction may be hydrogen fluoride that is generated by hydrolysis of the phosphor in the case where an aqueous solution is added, residual hydrogen fluoride that is present in the phosphor, or hydrofluoric acid that is added as a solvent. Since this reaction is performed with the phosphor in a state of dispersion in the solvent, it can be performed by adding the compound to serve as the Ca source during the washing step or the like after precipitation of the complex fluoride crystal in the process for producing the phosphor.

The Ca alone or Ca-containing compound does not necessarily need to be present over the entire particle surface of the phosphor, and the moisture resistance can be improved even if it is present on only a portion thereof.

If the Ca content is too low, the hydrolysis prevention effect cannot be achieved, and if there is too much, there is a tendency for the light emission properties of the phosphor to be detrimentally affected. For this reason, the Ca content, by mass per million in the phosphor, should be at least 20 ppm and at most 10,000 ppm, more preferably at least 20 ppm and at most 1000 ppm, even more preferably at least 20 ppm and at most 500 ppm, even more preferably at least 30 ppm and at most 200 ppm, and even more preferably at least 30 ppm and at most 150 ppm.

On the other hand, the means for making the particle surface of the phosphor comprise Cl is not particularly limited as long as Cl alone or a Cl-containing compound generated from the Cl source is able to be physically or chemically deposited on the phosphor particle surface, and it may be wet or dry. As a means for including Cl on the particle surface of the phosphor, a typical means involves immersing a pre-manufactured phosphor of general formula $A_2MF_6:Mn^{4+}$ in an aqueous solution containing a Cl source and inducing a reaction, so as to substitute a portion of the F constituting the matrix crystal of the phosphor with Cl. Even if a portion of the F is substituted with Cl in this way, the same crystal structure as before the substitution is maintained.

A preferable example for including Cl on the particle surface of the phosphor is indicated below.

First, the phosphor is dispersed in an organic solvent alone or in a mixed solution with hydrofluoric acid, to prepare a suspension. The organic solvent is preferably acetone, methanol, ethanol or the like. Next, to this suspension is added a solution in which is dissolved a compound to serve as a Cl source, such as calcium chloride. This solvent may be water or an organic solvent. The hydrogen fluoride present in the suspension reacts with the elements of the positive ions in the Cl source compound, and the Cl ions are freed and substitute a portion of the fluorine. When calcium chloride is used as the Cl source compound, the calcium reacts with fluorine.

The hydrogen fluoride which is the reaction source of this reaction may be hydrogen fluoride that is generated by hydrolysis of the phosphor in the case where an aqueous solution is added, residual hydrogen fluoride that is present in the phosphor, or hydrofluoric acid that is added as a solvent. Since this reaction is performed with the phosphor in a state of dispersion in the solvent, it can be performed by adding the compound to serve as the Cl source during the washing step or the like after precipitation of the complex fluoride crystal in the process for producing the phosphor.

The Cl alone or Cl-containing compound does not necessarily need to be present over the entire particle surface of the phosphor, and the moisture resistance can be improved even if it is present on only a portion thereof.

If the Cl content is too low, the hydrolysis prevention effect cannot be achieved, and if there is too much, there is a tendency for the light emission properties of the phosphor to be detrimentally affected. For this reason, the Cl content, by mass per million in the phosphor, should be at least 20 ppm and at most 300 ppm, and more preferably at least 20 ppm and at most 250 ppm.

The light emitting element of the present invention comprises the aforementioned phosphor of the present invention and an emission light source.

The emission light source may be a visible light LED or a UV LED that emits light of wavelengths of at least 250 nm and at most 550 nm, among which a blue LED light emitting element of at least 420 nm and at most 500 nm is preferred.

As the phosphor used in the light emitting element, other conventionally known phosphors may be used in combination with the phosphor of the present invention. By combining the phosphor of the present invention with a phosphor emitting a different color of light such as a green light-emitting phosphor, a yellow light-emitting phosphor or a red light-emitting phosphor, higher color rendering properties and higher luminance can be obtained.

The light emitting device according to the present invention uses the aforementioned light emitting element of the present invention, and examples include a backlight of a liquid crystal panel, an illumination device, a signal device used on roads or railways, or a projector.

EXAMPLES

Herebelow, the present invention will be described in further detail by means of the examples indicated below.

<Production of Raw Material $K_2MnF_6$>

First, the production method of $K_2MnF_6$ used as the Mn raw material of the phosphor in the following examples and comparative examples will be explained.

800 ml of hydrofluoric acid at a concentration of 40 mass % was poured into a Teflon (registered trademark) beaker with a capacity of 1 liter, and 260 g of $KHF_2$ powder (special grade chemical manufactured by Wako Pure Chemical Industries) and 12 g of potassium permanganate powder (grade 1 chemical manufactured by Wako Pure Chemical Industries) were dissolved.

While stirring the hydrofluoric acid reactant using a magnetic stirrer, 8 ml of 30% hydrogen peroxide water (special grade chemical manufactured by Wako Pure Chemical Industries) were dripped in a little at a time. When the dripped amount of hydrogen peroxide water exceeded a standard amount, yellow particles began to precipitate, and the color of the reactant began to change from purple. The stirring was continued for a while after dripping in the standard amount of hydrogen peroxide water, then the stirring was stopped and the precipitated particles were allowed to settle. The above-described reaction was entirely performed at ambient temperature.

After the precipitated particles settled, the operation of removing the supernatant, adding methanol, stirring and allowing to stand, then removing the supernatant and further adding methanol was repeated until the solution became neutral. Thereafter, the precipitated particles were recovered by filtration and dried, and the methanol was completely removed by evaporation to obtain 19 g of a $K_2MnF_6$ powder.

Examples 1 to 7 and Comparative Examples 1 and 2

Examples 1 to 7 and Comparative Examples 1 and 2 all relate to phosphors represented by the general formula: $A_2MF_6:Mn^{4+}$, wherein element A is K, element M is Si, F is fluorine, and Mn is manganese, in other words, phosphors represented by $K_2SiF_6:Mn^{4+}$. Comparative Example 1 is a conventional phosphor not comprising Ca or Cl on the particle surface, and Examples 1 to 7 and Comparative Example 2 are phosphors comprising Ca or Cl on the particle surface.

Comparative Example 1

At ambient temperature, 500 ml of hydrofluoric acid at a concentration of 48 mass % was poured into a Teflon (registered trademark) beaker with a capacity of 1 liter, 50 g of $K_2SiF_6$ powder (manufactured by Wako Pure Chemical Industries, grade: for chemical use) and 5 g of $K_2MnF_6$ powder synthesized by the aforementioned method were added thereto to prepare a suspension.

The Teflon (registered trademark) beaker containing the suspension was placed on a hot plate and heated while stirring. After heating to about 80° C. and holding for a while, the inside of the beaker was inspected, and the powder was found to be completely dissolved and the solution had changed to a light brown color. This aqueous solution of hydrofluoric acid was further heated and the solvent was evaporated. With the evaporation of the solvent, pale yellow crystals were precipitated. Heating was stopped when the solvent amount was considerably reduced, and the solution was cooled to room temperature. Thereafter, the solution was washed with hydrofluoric acid having a concentration of 20 mass % and methanol, the solid part was separated and recovered by filtration, and the residual methanol was removed by evaporation using a drying treatment. A nylon sieve having 75 μm openings was used on the phosphor after the drying treatment to separate out only the matter passing through the sieve, resulting in the phosphor $K_2SiF_6:Mn^{4+}$ of Comparative Example 1.

Example 1

20 g of the phosphor of Comparative Example 1 were added to 100 ml of a mixed solution (volume ratio 1:1) of hydrofluoric acid having a concentration of 20% and methanol to prepare a suspension.

While stirring this suspension, 25 ml of an aqueous solution of calcium nitrate having a concentration of 0.6 mol % were added. After addition, the suspension was further stirred for 10 minutes. After the stirring ended, the suspension was let stand to allow the phosphor to settle, and the operation of removing the supernatant, adding methanol thereto, stirring and allowing to stand, then removing the supernatant and further adding methanol was repeated until the solution became neutral.

Thereafter, the precipitated particles were recovered by filtration, and further dried to completely remove the methanol by evaporation, resulting in the phosphor of Example 1.

Examples 2 and 3 and Comparative Example 2

Examples 2 and 3 and Comparative Example 2 were produced using entirely the same methods and conditions as Example 1, except that the concentration of the aqueous solution of calcium nitrate added to the phosphor suspension was changed respectively to 0.3 mol %, 1.0 mol % and 0.1 mol %.

Example 4

20 g of the phosphor of Comparative Example 1 were added to 100 ml of a mixed solution (volume ratio 1:1) of hydrofluoric acid having a concentration of 20% and methanol to prepare a suspension.

While stirring this suspension, 20 ml of an aqueous solution of calcium chloride having a concentration of 0.6 mol % were added. After addition, the suspension was further stirred for 10 minutes. After the stirring ended, the suspension was let stand to allow the phosphor to settle, and the operation of removing the supernatant, adding methanol thereto, stirring and allowing to stand, then removing the supernatant and further adding methanol was repeated until the solution became neutral.

Thereafter, the precipitated particles were recovered by filtration, and further dried to completely remove the methanol by evaporation, resulting in the phosphor of Example 4.

Examples 5 to 7

Examples 5 to 7 were produced using entirely the same methods and conditions as Example 4, except that the concentration of the aqueous solution of calcium chloride added to the phosphor suspension was changed respectively to 0.4 mol %, 0.8 mol % and 1.6 mol %.

<Evaluation of Phosphor>

Next, the resulting phosphors were evaluated by the following method.

First, the phosphors of Comparative Examples 1 and 2 and Examples 1 to 3 were evaluated as to their crystal phases, excitation spectrum/fluorescence spectrum, quantum efficiency, chromaticity coordinates, Ca content and moisture resistance. The evaluation results are shown in Table 1 and FIGS. 1 and 2.

TABLE 1

| | | | | Optical Properties (excitation 455 nm) | | | | |
|---|---|---|---|---|---|---|---|---|
| | Calcium Nitrate Conc. | Chromaticity Coordinates | | Ca Content | Absorption | Internal Quantum Efficiency | External Quantum Efficiency (%) High-Temperature High-Humidity Treatment | | Moisture Resistance Evaluation |
| | (mol %) | x | y | (ppm) | (%) | (%) | before | after | |
| Comp. Ex. 1 | — | 0.691 | 0.307 | — | 74 | 85 | 63 | 50 | 79% |
| Ex. 1 | 0.6 | 0.691 | 0.307 | 69 | 75 | 85 | 64 | 62 | 97% |
| Ex. 2 | 0.3 | 0.691 | 0.307 | 35 | 74 | 85 | 63 | 59 | 94% |
| Ex. 3 | 1.0 | 0.692 | 0.306 | 120 | 73 | 84 | 61 | 60 | 98% |
| Comp. Ex. 2 | 0.1 | 0.691 | 0.307 | 11 | 74 | 86 | 64 | 53 | 83% |

<Crystal Phase>

The X-ray diffraction patterns of the phosphors were measured using an X-ray diffraction apparatus (Rigaku Ultima IV). The measurements were made using a Cu Kα tube.

The phosphors of Comparative Examples 1 and 2 and Examples 1 to 3 all had the same pattern as a $K_2SiF_6$ crystal, and did not include any other crystal phases. The results of X-ray diffraction of a $K_2SiF_6$ crystal, the phosphor of Example 1 and the phosphor of Comparative Example 1 are shown in FIG. 1.

<Excitation Spectrum/Fluorescence Spectrum>

The excitation and fluorescence spectra of the phosphors were measured using a fluorescence spectrophotometer (Hitachi High Technologies F-7000). The excitation wavelength of the fluorescence spectrum during these measurements was 455 nm, and the monitored fluorescence wavelength of the excitation spectrum was 632 nm.

Figure 2:
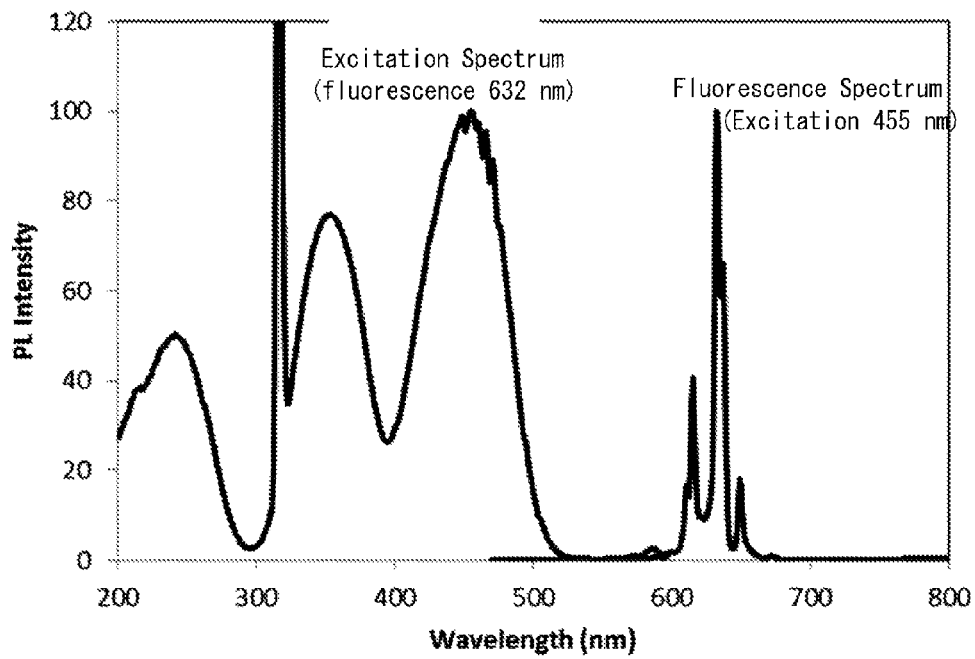
FIG. 2 A diagram showing the excitation/fluorescence spectra of the phosphor of Comparative Example 1.

The measurement results for the phosphor of Comparative Example 1 are shown in FIG. 2. The phosphor of Comparative Example 1 had two excitation bands, of UV light with a peak wavelength in the vicinity of 350 nm and of blue light with a peak wavelength in the vicinity of 450 nm, and had a plurality of narrow-band light emissions in the red region of 600 to 700 nm.

The excitation and fluorescence spectra as measured by the fluorescence spectrophotometer for the phosphors of Comparative Example 2 and Examples 1 to 3 were almost the same shape as Comparative Example 1.

<Quantum Efficiency>

The quantum efficiencies of the phosphors were evaluated at ambient temperature by the following method.

A standard reflective plate (Labsphere Spectralon) having a reflectivity of 99% was set at a side-surface aperture ($\phi$10 mm) of an integrating sphere ($\phi$60 mm). As an emission light source, monochromatic light divided into a wavelength of 455 nm from a Xe lamp was directed to this integrating sphere through an optical fiber, and the spectrum of the reflected light was measured using a spectrophotometer (Otsuka Electronics MCPD-7000). At that time, the number of excitation light photons (Qex) was calculated using the spectrum in the wavelength range of 450 to 465 nm.

Next, recessed cells filled with phosphors so that the surfaces were flat were set at the aperture of the integrating sphere and illuminated with monochromatic light of wavelength 455 nm, and the spectra of the reflected excitation light and the fluorescent light were measured by a spectrophotometer. The number of photons of the reflected excitation light (Qref) and the number of photons of fluorescent light (Qem) were calculated from the resulting spectral data.

The number of reflected excitation light photons was measured in the same wavelength range as the number of excitation light photons, and the number of fluorescent light photons was calculated in the range of 465 to 800 nm.

From the numbers of these three types of photons, the external quantum efficiency=Qem/Qex×100, the absorption rate=(Qex−Qref)/Qex×100 and the internal quantum efficiency=Qem/(Qex−Qref)×100 were determined.

<Chromaticity Coordinates>

The chromaticity coordinates (x,y) were calculated using a color function such as CIE1931 in accordance with the calculation method in the XYZ colorimetric system defined in JIS Z 8701, using a method compliant with JIS Z 8724 (Methods of Color Measurement—Light-source color—) for the spectra measured by setting the phosphors. The wavelength range used for chromaticity coordinate calculation was 465 to 780 nm.

<Ca Content>

2 ml of 48% hydrofluoric acid and 1 ml of 60% nitric acid were added to 0.1 g of a phosphor sample, and pressurized acid decomposition was performed for 12 hours at 160° C. 5 ml of this decomposed solution was taken and measured using an ICP emission spectrometer (Shimadzu ICPE-9000), to calculate the Ca content (ppm) in the phosphor. The Ca content of Comparative Example 1 measured by this method was less than the lower limit of detection (1 ppm).

On the other hand, the Ca contents of Examples 1, 2, 3 and Comparative Example 2 were respectively 69 ppm, 35 ppm, 120 ppm and 11 ppm.

<Moisture Resistance Evaluation>

The moisture resistance of the phosphors were evaluated by the following method.

3 g of the phosphor were loaded in a $\phi$55 mm petri dish composed of PFA, which was set inside a thermo-hydrostat (Yamato Scientific IW222) and treated for 4 hours under high-temperature high-humidity conditions of temperature 60° C. and relative humidity 90% RH, after which the external quantum efficiency was measured by the above-mentioned method and compared with the external quantum efficiency before the high-temperature high-humidity treatment. In other words, [external quantum efficiency after high-temperature high-humidity treatment]/[external quantum efficiency before high-temperature high-humidity treatment]×100 was calculated and evaluated as an indicator of the moisture resistance.

In the case of Comparative Example 1, the absorption rate for excitation at 455 nm, the internal quantum efficiency, the external quantum efficiency and the chromaticity coordinates (x,y) after the high-temperature high-humidity treatment were respectively 76%, 66%, 50% and (0.690,0.307). Due to the high-temperature high-humidity treatment, the internal quantum efficiency was largely reduced, and as a result, the external quantum efficiency was 79% of the efficiency before the high-temperature high-humidity treatment, lower than the 85% which was the passing grade for the moisture resistance evaluation.

On the other hand, in the case of Example 1, the external quantum efficiency of the phosphor after the high-temperature high-humidity treatment was 62%, and the moisture resistance evaluation was 97%. Additionally, the moisture resistance evaluations for the phosphors of Examples 2 and 3 were respectively 94% and 98%, while the moisture resistance evaluation for the phosphor of Comparative Example 2 not satisfying a Ca content of 20 ppm was 83%.

As shown in Table 1, by including Ca in a concentration range of at least 20 ppm and at most 10,000 ppm on the particle surface of the phosphor, a significant improvement in moisture resistance was observed.

Next, the phosphors of Comparative Example 1 and Examples 4 to 7 were evaluated in the above-mentioned categories excluding "Ca content", and also evaluated for "Cl content". The evaluation method of the "Cl content" was as follows. The evaluation results are shown in Table 2.

Figure 3:
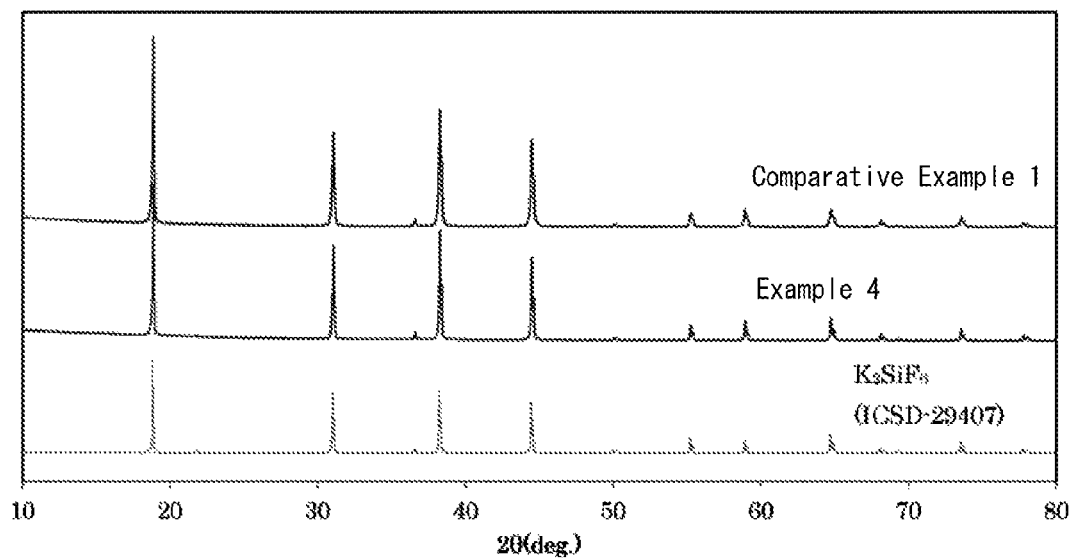
FIG. 3 A diagram showing the X-ray diffraction patterns of $K_2SiF_6$, Example 4 and Comparative Example 1.

Additionally, the results of X-ray diffraction of a $K_2SiF_6$ crystal, the phosphor of Example 4 and the phosphor of Comparative Example 1 are shown in FIG. 3. The phosphors of Examples 4 to 7 all had the same pattern as the $K_2SiF_6$ crystal, and did not include other crystal phases.

TABLE 2

| | | | | | | External Quantum Efficiency (%) High-Temperature High-Humidity Treatment | | |
|---|---|---|---|---|---|---|---|---|
| | Calcium Nitrate Conc. | Chromaticity Coordinates | | Ca Content | Absorption | Internal Quantum Efficiency | | Moisture Resistance |
| | (mol %) | x | y | (ppm) | (%) | (%) | before | after | Evaluation |
| Comp. Ex. 1 | — | 0.691 | 0.307 | 0 | 74 | 85 | 63 | 50 | 79% |
| Ex. 4 | 0.2 | 0.691 | 0.307 | 25 | 75 | 85 | 64 | 62 | 97% |
| Ex. 5 | 0.4 | 0.691 | 0.307 | 60 | 74 | 85 | 63 | 62 | 98% |

TABLE 2-continued

| | Calcium Nitrate Conc. | Chromaticity Coordinates | | Ca Content | Absorption | Internal Quantum Efficiency | External Quantum Efficiency (%) High-Temperature High-Humidity Treatment | | Moisture Resistance |
|---|---|---|---|---|---|---|---|---|---|
| | (mol %) | x | y | (ppm) | (%) | (%) | before | after | Evaluation |
| Ex. 6 | 0.8 | 0.690 | 0.308 | 122 | 74 | 84 | 62 | 60 | 97% |
| Ex. 7 | 1.6 | 0.692 | 0.305 | 236 | 75 | 82 | 62 | 54 | 87% |

<Chlorine Content>

The Cl contents of the phosphors were measured using ion chromatography/IC (Dionex DX-320). 50 ml of water were poured into a resin container, and transferred to a 50° C. thermostatic tank. After confirming that the water was at 50° C., 0.5 g of a phosphor sample were added and the result was stirred for 10 minutes. After stirring, a 0.45 μm membrane filter was used to remove the phosphor and extract only the aqueous solution. In accordance with the calibration concentration, dilution was performed and IC measurements were taken to calculate the Cl content (ppm) of the phosphor.
The measurement conditions were as follows.
Measurement column: Ion Pac AG22/AS22
Eluent: $Na_2CO_3$ 4.5 mmol/L, $NAHCO_3$ 4.0 mmol/L
Eluent flow rate: ½ ml/L
Thermostat temperature: 35° C.
Electrical conductivity (detector) with suppressor: 50 mA
Sample introduction amount: 50 μL As shown in Table 2, a significant improvement in moisture resistance was observed when Cl was included on the particle surface of the phosphors in a concentration range of at least 20 ppm and at most 300 ppm.

Example 8 and Comparative Example 3

Example 8 and Comparative Example 3 both relate to phosphors represented by the general formula: $A_2MF_6$:$Mn^{4+}$, wherein element A is K, element M is Ge, F is fluorine, and Mn is manganese, in other words phosphors represented by $K_2GeF_6$:$Mn^{4+}$. Comparative Example 3 is a conventional phosphor not comprising Ca or Cl on the particle surface, and Example 8 is a phosphor comprising Ca on the particle surface.

<Production of Raw Material $K_2GeF_6$>

The $K_2GeF_6$ to be used as the Ge raw material of the phosphors of Example 8 and Comparative Example 3 were produced by the methods indicated below.

At ambient temperature, 800 ml of hydrofluoric acid at a concentration of 55 mass % was poured into a Teflon (registered trademark) beaker with a capacity of 1 liter, and 42 g of $GeO_2$ powder (manufactured by Kojundo Chemical Laboratory, purity at least 99.99%) were dissolved. Since the heat of dissolution of the $GeO_2$ powder raised the solution temperature to 40° C. or more, the solution was allowed to cool by radiation to 30° C. or lower. While stirring this aqueous solution of hydrofluoric acid using a magnetic stirrer, 95 g of a $KHF_2$ powder (special grade chemical manufactured by Wako Pure Chemical Industries) were added. The stirring was continued for about 10 minutes after addition, after which the stirring was stopped and the particles in the solution were allowed to settle.

After the particles settled, the operation of removing the supernatant, adding methanol, stirring and allowing to stand, then removing the supernatant and further adding methanol was repeated until the solution became neutral. Thereafter, the particles were recovered by filtration and further dried, and the methanol was completely removed to obtain 53 g of a white powder. This white powder was confirmed to be a single-phase $K_2GeF_6$ crystal as a result of measurement of the X-ray diffraction pattern.

Comparative Example 3

At ambient temperature, 500 ml of hydrofluoric acid at a concentration of 48 mass % was poured into a Teflon (registered trademark) beaker with a capacity of 1 liter, and 50 g of $K_2GeF_6$ powder synthesized by the aforementioned method and 4 g of $K_2MnF_6$ powder were added thereto to prepare a suspension.

This suspension was heated by the same method as Comparative Example 1 to evaporate the solvent, causing precipitation of a yellow crystal, which was washed with hydrofluoric acid having a concentration of 20 mass % and methanol, then filtered and dried to obtain the phosphor of Comparative Example 3 in the form of a yellow powder.

<Evaluation of Phosphor of Comparative Example 3>

The yellow powder of Comparative Example 3, as a result of X-ray diffraction, was found to have the same pattern as $K_2GeF_6$ crystal, and no other crystal phases were detected.

Figure 4:
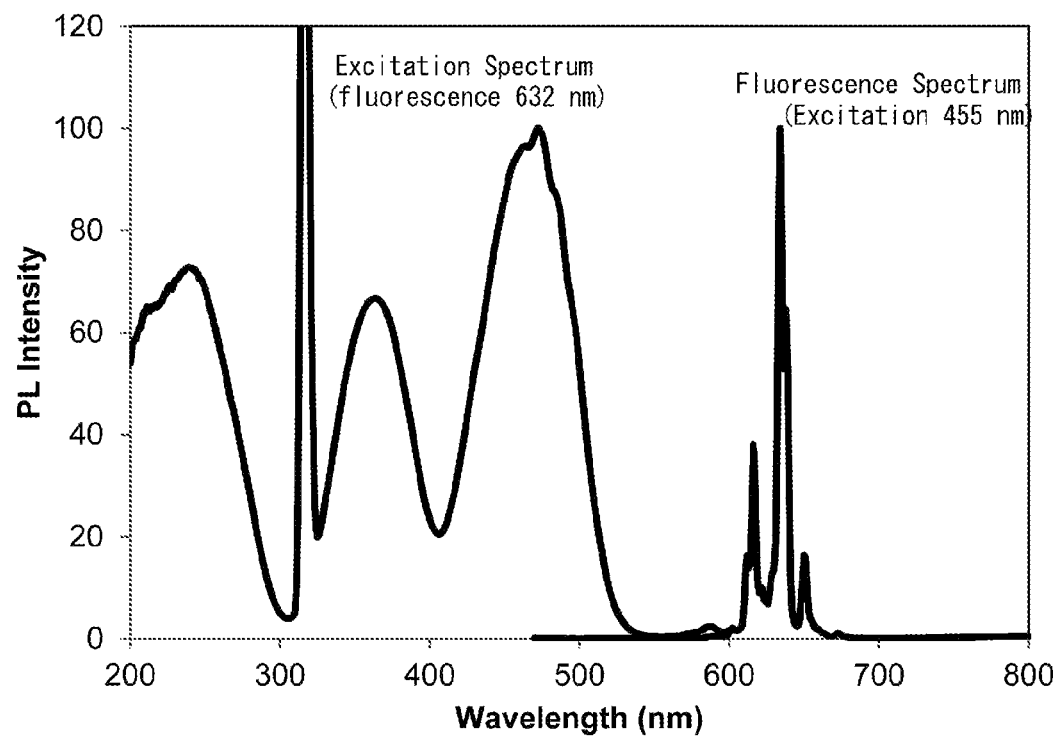
FIG. 4 A diagram showing the excitation/fluorescence spectra of the phosphor of Comparative Example 3.

The excitation/fluorescence spectra measured using a fluorescence spectrophotometer are shown in FIG. 4. The excitation wavelength of the fluorescence spectrum during these measurements was 455 nm, and the monitored fluorescence wavelength of the excitation spectrum was 632 nm. The excitation spectrum of the phosphor of Comparative Example 3 was slightly shifted towards longer wavelengths compared to Comparative Example 1, but the fluorescence spectrum was almost the same as Comparative Example 1.

The rate of absorption when excited with blue light having a wavelength of 455 nm was 78%, the internal quantum efficiency was 88%, the external quantum efficiency was 68% and the chromaticity (x,y) was (0.693, 0.305).

The Ca content of Comparative Example 3 was less than the lower limit of detection (1 ppm). The external quantum efficiency of the phosphor after high-temperature high-humidity treatment (60° C., 90% RH, 4 hours) was 54%, and the moisture resistance evaluation was 78%.

Example 8

20 g of the phosphor of Comparative Example 3 were added to 100 ml of a mixed solution (volume ratio 1:1) of hydrofluoric acid having a concentration of 20% and methanol to prepare a suspension.

While stirring this suspension, 30 ml of a methanol solution of calcium chloride having a concentration of 0.6 mol % were added. After addition, the suspension was further stirred for 10 minutes. After the stirring ended, the suspension was let stand to allow the phosphor to settle, and the operation of removing the supernatant and further adding methanol was repeated until the solution became neutral. Thereafter, the precipitated particles were recovered by filtration, and further dried to completely remove the methanol by evaporation, resulting in the phosphor of Example 8.
<Evaluation of Phosphor of Example 8>

The results of X-ray diffraction measurements and excitation/fluorescence spectrum measurements were almost the same as Comparative Example 3. The rate of absorption when excited with blue light having a wavelength of 455 nm was 78%, the internal quantum efficiency was 86%, the external quantum efficiency was 67% and the chromaticity (x,y) was (0.695, 0.305).

The Ca content of Example 8 was 55 ppm. The external quantum efficiency of the phosphor after the high-temperature high-humidity treatment was 66%, and the moisture resistance evaluation was 99%. Thus, it was confirmed that the moisture resistance is significantly improved by including Ca in a concentration range of at least 20 ppm and at most 10,000 ppm on the particle surface of a phosphor represented by $K_2GeF_6:Mn^{4+}$.

Example 9

A light emitting element comprising the phosphor of Example 1 and a blue light-emitting LED as the light emission light source was prepared. This light emitting element used the phosphor of Example 1 which has excellent moisture resistance, and therefore, in addition to having excellent color rendering properties and color reproducibility, the light emitting element had a milder decrease in luminance over time than a light emitting element using the phosphor of Comparative Example 1.

Example 10

An illumination device was prepared as a light emitting device using the light emitting element of Example 9. This light emitting device used the phosphor of Example 1 which has excellent moisture resistance, and therefore, in addition to having excellent color rendering properties and color reproducibility, the light emitting device had a milder decrease in luminance over time than a light emitting device using the phosphor of Comparative Example 1.

The invention claimed is:

1. A phosphor represented by the general formula: $A_2MF_6:Mn^{4+}$, wherein element A is an alkali metal element comprising at least K, element M is one or more metal elements chosen from among Si, Ge, Sn, Ti, Zr and Hf, F is fluorine, and Mn is manganese, wherein the phosphor comprises Ca in a concentration range of at least 20 ppm and at most 10,000 ppm or Cl in a concentration range of at least 20 ppm and at most 300 ppm.

2. The phosphor according to claim 1, wherein the element A is K, and the element M is Si and/or Ge.

3. A light emitting element comprising an emission light source and the phosphor according to either claim 1.

4. A light emitting device comprising the light emitting element according to claim 3.

* * * * *